United States Patent
Khamankar et al.

(10) Patent No.: US 7,560,792 B2
(45) Date of Patent: Jul. 14, 2009

(54) RELIABLE HIGH VOLTAGE GATE DIELECTRIC LAYERS USING A DUAL NITRIDATION PROCESS

(75) Inventors: Rajesh Khamankar, Coppell, TX (US); Douglas T. Grider, McKinney, TX (US); Hiroaki Niimi, Austin, TX (US); April Gurba, Allen, TX (US); Toan Tran, Rowlett, TX (US); James J. Chambers, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/626,624

(22) Filed: Jan. 24, 2007

(65) Prior Publication Data

US 2007/0117331 A1    May 24, 2007

Related U.S. Application Data

(62) Division of application No. 10/702,234, filed on Nov. 6, 2003, now Pat. No. 7,183,165.

(60) Provisional application No. 60/428,871, filed on Nov. 25, 2002.

(51) Int. Cl.
*H01L 27/105* (2006.01)

(52) U.S. Cl. .............................. 257/500; 257/E27.081

(58) Field of Classification Search .............. 257/368, 257/500, 510, 365, E21.081; 438/287
See application file for complete search history.

(56) References Cited

U.S. PATENT DOCUMENTS

| 6,087,236 | A | 7/2000 | Chau et al. |
| 6,346,442 | B1 * | 2/2002 | Aloni et al. ................. 438/258 |
| 6,458,663 | B1 | 10/2002 | Moore et al. |
| 6,541,395 | B1 | 4/2003 | Trivedi et al. |
| 6,597,046 | B1 | 7/2003 | Chau et al. |
| 6,716,685 | B2 | 4/2004 | Lahaug |
| 7,045,860 | B2 * | 5/2006 | Kikuchi et al. .............. 257/343 |
| 2004/0067619 | A1 | 4/2004 | Niimi et al. |
| 2004/0070046 | A1 | 4/2004 | Niimi |
| 2005/0205948 | A1 | 9/2005 | Rotondaro et al. |

FOREIGN PATENT DOCUMENTS

JP    04154162 A    5/1992

* cited by examiner

*Primary Examiner*—Nathan W Ha
(74) *Attorney, Agent, or Firm*—Wade J. Brady, III; Frederick J. Telecky, Jr.

(57) ABSTRACT

Dual gate dielectric layers are formed on a semiconductor substrate for MOS transistor fabrication. A first dielectric layer (30) is formed on a semiconductor substrate (10). A first plasma nitridation process is performed on said first dielectric layer. The first dielectric layer (30) is removed in regions of the substrate and a second dielectric layer (50) is formed in these regions. A second plasma nitridation process is performed on the first dielectric layer and the second dielectric layer. MOS transistors (160, 170) are then fabricated using the dielectric layers (30, 50).

4 Claims, 2 Drawing Sheets

RELIABLE HIGH VOLTAGE GATE DIELECTRIC LAYERS USING A DUAL NITRIDATION PROCESS

This application is a divisional of application Ser. No. 10/702,234, filed Nov. 6, 2003, now U.S. Pat. No. 7,183,165, issued Feb. 27, 2007, which claims the benefit of provisional Application No. 60/428,871, filed Nov. 25, 2002.

FIELD OF THE INVENTION

The present invention relates to a method for forming dual gate (or split gate) dielectrics for integrated circuit MOS transistors using a dual plasma nitridation process.

BACKGROUND OF THE INVENTION

High performance integrated circuits often require metal oxide semiconductor (MOS) transistors to operate at different voltages. Given the electric field constraints required for reliable transistor operation, different operating voltages will require that the MOS transistors on the same integrated circuit be formed with more than one gate dielectric thickness. For example a 0.18☐ m gate length transistor designed to operate at 1.8 volts may require a gate dielectric thickness of 38 Å while a 0.5☐ m gate length transistor designed to operate at 3.3 volts will require a gate dielectric thickness of 65 Å.

Shown in FIG. 1 are two MOS transistors 120 and 130 with differing gate dielectric thickness. The semiconductor substrate 10 can comprise epitaxial layers and/or buried insulator structures. The isolation structure 20 is a shallow trench isolation (STI) structure and is formed using standard processing technology. Other isolation structures such as localized oxidation of silicon (LOCOS) can also be used. To form the gate dielectric layers 140 and 150 a split gate process can be used. In the split gate process a first dielectric layer is grown on the surface of the semiconductor substrate 10. The region of the first dielectric layer that will eventually form the dielectric layer 150 is masked using a patterned photomask and the unmasked regions of the first dielectric layer removed. Following the removal of the patterned photomask the dielectric layer 140 is formed. Formation of dielectric layer 140 comprises thermally growing the dielectric layer. During the growth process addition dielectric layer thickness is added to the remaining first dielectric layer resulting in dielectric layer 150 being formed. For the transistors described above the dielectric layer 140 for the lower voltage transistor 120 will be about 38 Å thick and the dielectric layer 150 for the higher voltage transistor 130 will be about 65 Å thick. Following the formation of the dielectric layers 140 and 150, the gate structures 60 and 70 of the MOS transistors are formed. If source and drain extension regions are required these are formed at this time by implanting the required dopant species into the semiconductor substrate aligned to the edge of the gate structures 60 and 70. Sidewall structures 80 and 90 are formed adjacent to the gate structures 60 and 70 followed by the formation of the source and drain regions 100 and 110.

As the current size of the MOS transistors is reduced the thickness of the gate dielectric layers used to form these transistors must also be reduced to ensure proper operation. The transistor gate leakage current is related to the thickness of the dielectric layer increasing with a reduction in dielectric layer thickness. For the thinner gate dielectric layer (i.e., 140 in FIG. 1) techniques such as the addition of nitrogen to the dielectric layer have been used to reduce the transistor gate leakage current. Previously the thickness of the dielectric layer for the higher voltage transistor has been such that no special techniques were required to keep the gate leakage current for these transistors below acceptable levels. However as the transistors continue to scale downwards gate leakage currents from the higher voltage transistors 130 with the thicker dielectric layers 150 is becoming a serious limitation to integrated circuit performance. There is therefore a need for a method to simultaneously optimize both dielectric layers for reduced gate leakage current while reducing the dielectric layer thickness.

SUMMARY OF INVENTION

The instant invention is a method for forming multiple gate dielectrics with different thickness. The method comprises forming first dielectric layer on a semiconductor substrate. The first dielectric layer can comprise silicon oxide or silicon oxynitride formed using thertmal or plasma techniques. The first dielectric layer is then subjected to a plasma nitridation process that incorporates nitrogen into the layer. Using masking techniques, the first dielectric layer is removed from regions of the substrate and a second dielectric layer formed in regions from which the first dielectric layers were removed. The second dielectric layer and the first dielectric layer are subjected to a second plasma nitridation process that incorporates nitrogen into both layers. MOS transistors are formed using the different dielectric layers.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1:
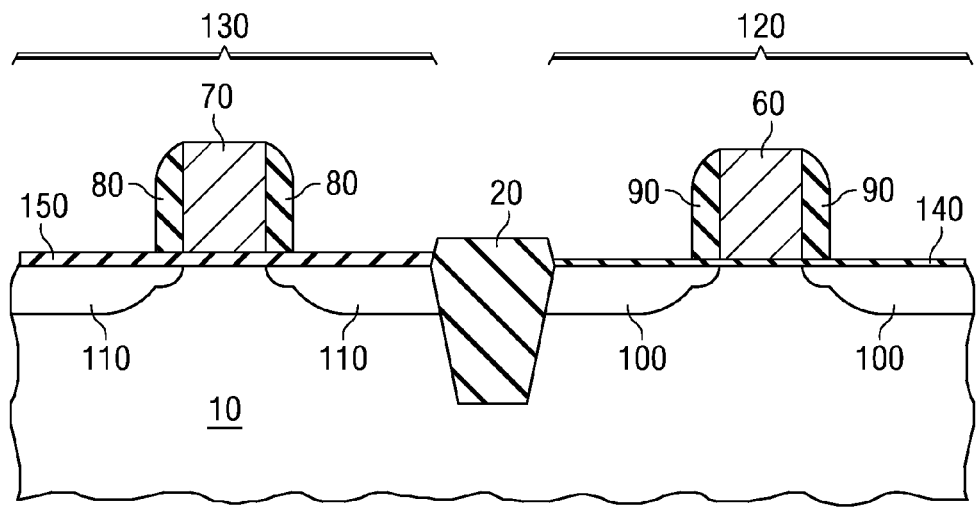
FIG. 1 is a cross-sectional diagram showing MOS transistors with different gate dielectric layer thickness.
Figure 2A:
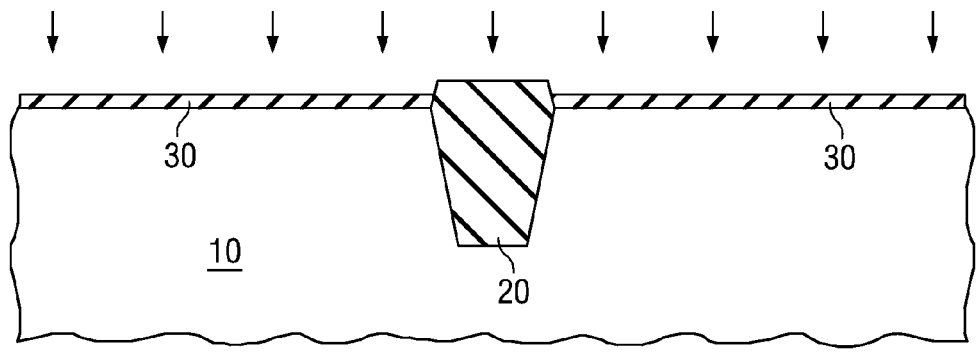
FIGS. 2(a)-2(c) are cross-sectional diagrams showing an embodiment of the instant invention.

The semiconductor substrate 10 shown in FIG. 2(a) can comprise a bulk substrate, an epitaxial layer, and/or a buried insulator layer. Isolation structures 20 formed in the substrate 10 can comprise STI structures, LOCOS isolation or any other suitable isolation scheme or structure. Following the formation of the isolation structures 20 and any additional processes, a first dielectric layer 30 is formed on the substrate surface as shown in FIG. 2(a). In a first embodiment of the instant invention a thermal oxidation process is used to form a first dielectric layer 30 comprising silicon oxide. The thermal oxidation process comprises oxidation temperatures of 600° C. to 1000° C. using gases from the group comprising $O_2$, $O_3$, $N_2O$, $NO$, $O_2/N_2$, $N_2O/N_2$ or $NO/N_2$ along with any other suitable gases. The silicon oxide thickness so formed will be between 15 to 35 angstroms thick. In a preferred embodiment the silicon oxide thickness will be 25 angstroms thick. In a second embodiment of the instant invention a plasma oxidation process can be used to form the first dielectric layer 30. Such a process can be performed at temperatures up to 700° C. at power levels of 50 watts to 2000 watts using RF or microwave plasma excitation. Gases such as $O_2$, $N_2O$, $NO$, $O_2/N_2$, $N_2O/N_2$ or $NO/N_2$ can be used to perform the oxidation in a He, Ar, Xe, or Kr plasma. The silicon oxide thickness so formed will be between 15 to 35 angstroms thick. Following the formation of the first dielectric layer 30, a first plasma nitridation process is performed on the first dielectric layer. In the first plasma nitridation process the first dielectric layer 30 is exposed to a plasma containing nitrogen species. During the process nitrogen is incorporated into the first dielectric layer. In a preferred embodiment a silicon oxide first dielectric layer is exposed to a nitrogen containing plasma formed using a power level of 600 to 950 Watts at a pressure of 15 to 24 millitorr with the plasma comprising nitrogen and helium gases. The first plasma nitridation process results in the formation of a plasma nitrided oxide layer. Following the first plasma nitridation process an optional anneal may be performed. In an embodiment the optional anneal comprises annealing the plasma nitrided oxide layer at 800° C. to 1000° C. in a $N_2/O_2$ ambient.

Figure 2B:
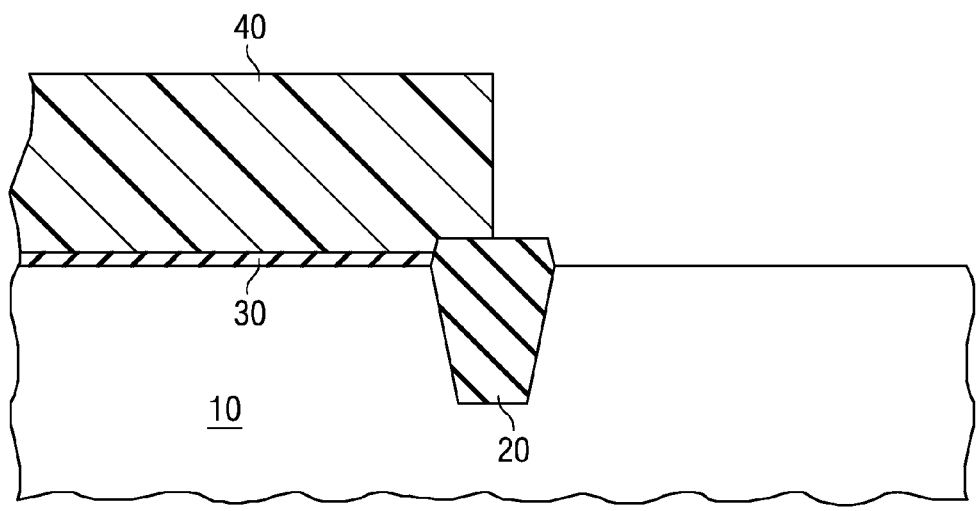

Following the formation of the first dielectric layer 30 and the subsequent first plasma nitridation treatment, a patterned photoresist layer 40 is formed over the first dielectric layer as shown in FIG. 2(b). The portions of the first dielectric layers not covered by the patterned photoresist layer 40 are then removed using standard techniques such as etching in 0.49% buffered hydrogen fluoride. Following the removal of the exposed first dielectric layer the patterned photoresist layer 40 is removed.

Figure 2C:
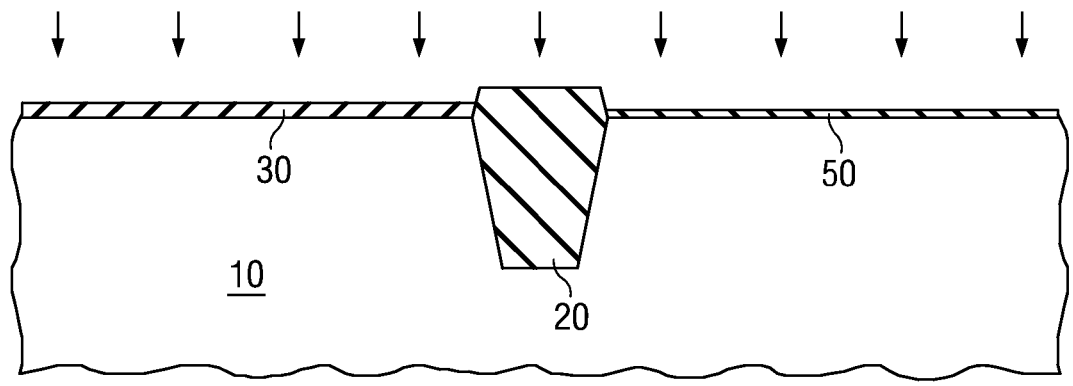

As shown in FIG. 2(c), a second dielectric layer 50 is formed on the surface of the substrate in those regions where the first dielectric layer was removed. In an embodiment of the instant invention the second dielectric layer 50 will comprise a plasma nitrided oxide. The plasma nitrided oxide can be formed using either a thermally grown silicon oxide layer or a deposited silicon oxide layer followed by a second plasma nitridation process. In the thermal oxidation process 8 to 19 angstroms of silicon oxide is formed at temperatures between 600° C. to 1100° C. using gases from the group comprising $O_2$, $O_3$, $N_2O$, NO, $O_2/N_2$, $O_3/N_2$, $N_2O/N_2$, $NO/N_2$, $H_2/O_2$, $H_2/O_3$, and any other suitable gas. Following the formation of the silicon oxide layer a second plasma nitridation process is performed. The second plasma nitridation process will incorporate 5 to 20 atomic percent of nitrogen into the silicon oxide layer resulting in a plasma nitrided oxide layer 50 with 5 to 20 atomic percent of nitrogen. In the second plasma nitridation process the silicon oxide layer is exposed to a RF or microwave He, Ar, Xe, or Kr plasma at power levels between 50 watts and 500 watts at pressures between 20 milliTorr and 200 milliTorr using gases from the group comprising $N_2$, $N_2O$, NO, or $NH_3$.

During the formation of the plasma nitrided dielectric layer 50, the dielectric layer 30 is exposed to all the processes. During the growth of the second dielectric layer 50, additional oxide growth will take place in the remaining region of the first dielectric layer 30. The amount of growth will be small compared to the thickness of the first dielectric layer. In addition the first dielectric layer will be exposed to the second plasma nitridation process of the second dielectric layer. Therefore the first dielectric layer 30 undergoes dual nitridation treatments. The first occurs during the first plasma nitridation treatment of the first dielectric layer and the second during the second plasma nitridation of the second dielectric layer. The dual plasma nitridation of the first dielectric layer 30 will result in a final nitrogen concentration of 5 to 15 atomic percent. The resulting nitrogen concentration will be uniformly distributed throughout the first dielectric layer 30.

Figure 3:
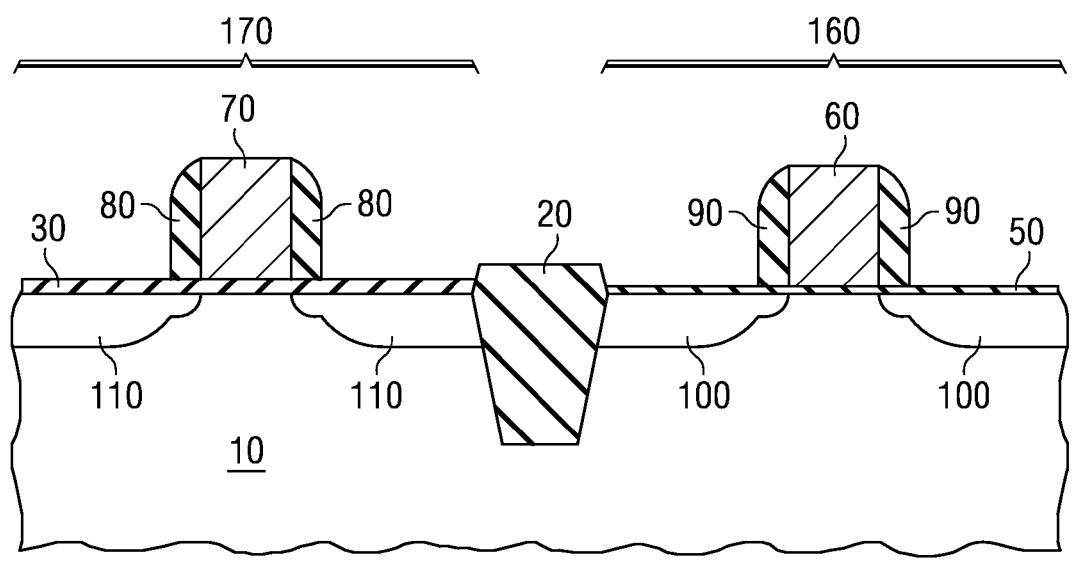
FIG. 3 is a cross-sectional diagram showing MOS transistors with different gate dielectric layer thickness according to an embodiment of the instant invention.

Shown in FIG. 3 are MOS transistors fabricated using the dielectric layers of the instant invention. The MOS transistor 160 formed using the plasma nitrided dielectric layer 50 will operate using the lower voltages and the MOS transistor formed using the dual plasma nitrided dielectric layer 30 will operate using the higher voltages. Therefore the operating voltage of MOS transistor 160 will be lower than the operating voltage of MOS transistor 170. The gate regions of the transistors 60 and 70 can be formed using polycrystalline silicon, a silicide or a metal. Any suitable dielectric material can be used to form the sidewall structures 80 and 90 and the source and drain regions 100 and 110 are formed using standard processing techniques.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. Integrated circuit MOS transistors, comprising:
   a semiconductor substrate;
   a first plasma nitrided oxide layer formed on a first dielectric layer of said semiconductor substrate;
   a second plasma nitrided oxide layer formed on the first plasma nitrided oxide layer and on a second dielectric layer of said semiconductor substrate, wherein said first plasma nitrided oxide layer comprises 5 to 20 atomic percent of nitrogen;
   a first transistor gate formed on said first region; and
   a second transistor gate formed on said second region.

2. The integrated circuit MOS transistors of claim 1 where said second plasma nitrided oxide layer comprises 5 to 15 atomic percent of nitrogen.

3. The integrated circuit MOS transistors of claim 1 wherein said first plasma nitrided oxide layer comprises silicon oxide.

4. The integrated circuit MOS transistors of claim 1 wherein said second plasma nitrided oxide layer comprises silicon oxide.

* * * * *